United States Patent
Ruck

(10) Patent No.: US 7,078,970 B2
(45) Date of Patent: Jul. 18, 2006

(54) CMOS CLASS AB OPERATIONAL AMPLIFIER

(75) Inventor: Bernhard Ruck, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 10/901,707

(22) Filed: Jul. 27, 2004

(65) Prior Publication Data

US 2005/0035822 A1 Feb. 17, 2005

(30) Foreign Application Priority Data

Jul. 31, 2003 (DE) ............................... 103 35 067

(51) Int. Cl.
*H03F 3/45* (2006.01)
*H03F 3/18* (2006.01)
*H03F 1/14* (2006.01)

(52) U.S. Cl. .................. 330/255; 330/264; 330/292
(58) Field of Classification Search ........... 330/264, 330/255, 267, 292

See application file for complete search history.

(56) References Cited

U.S. PATENT DOCUMENTS

| | | | | |
|---|---|---|---|---|
| 5,917,378 A | * | 6/1999 | Juang | 330/253 |
| 6,885,240 B1 | * | 4/2005 | Cha | 330/51 |
| 2001/0024140 A1 | * | 9/2001 | Taylor | 330/292 |

* cited by examiner

*Primary Examiner*—Robert Pascal
*Assistant Examiner*—Alan Wong
(74) *Attorney, Agent, or Firm*—Warren L. Franz; Wade James Brady, III; Frederick J. Telecky, Jr.

(57) ABSTRACT

A CMOS operational amplifier with a Class AB output stage has an output terminal and an input stage driving the output stage. The Class AB output stage includes a pair of p-channel and n-channel output transistors series-connected between the VDD and VSS supply terminals of a power supply. Each of the output transistors has associated biasing circuitry with a pair of positive and negative driving inputs and a biasing input. The input stage has driving outputs connected to corresponding ones of the driving inputs of the output stage. Each driving output is derived from the drain of a MOS transistor connected in series with a diode connected MOS transistor between the VDD and VSS supply terminals. By avoiding the conventional stacked MOSFETs that would set the minimum supply voltage to more than two threshold voltages, the op-amp can be operated over the full range of supply voltage.

6 Claims, 3 Drawing Sheets

US 7,078,970 B2

CMOS CLASS AB OPERATIONAL AMPLIFIER

CROSS REFERENCE TO RELATED APPLICATIONS

This application claims priority under 35 USC § 119 of German Application Serial No. 10335067.5, filed Jul. 31, 2003.

FIELD OF THE INVENTION

The present invention relates to an operational amplifier in CMOS technology with a Class AB output stage having an output terminal and an input stage driving the output stage.

BACKGROUND OF THE INVENTION

An operational amplifier in CMOS technology with a Class AB output stage is disclosed in a paper of A. Torralba, R. G. Carvajal, J. Martinez-Heredia and J. Ramirez-Angulo entitled "Class AB output stage for low voltage CMOS op-amps with accurate quiescent current control", Electronic letters, 2000, Vol. 36, No. 21, pp. 1753–1754. This output stage has a pair of p-channel and n-channel output transistors series-connected between the VDD and VSS supply terminals of a power supply. The stage has two pairs of drive inputs that require a floating voltage to be applied to each pair. Although this output stage can be operated at a low supply voltage close to the transistor threshold voltage, larger supply voltages require the polarity of the floating voltage sources to be inverted.

SUMMARY OF THE INVENTION

The present invention provides an improved CMOS Class AB operational amplifier that can be used as a buffer and can operated within a wide range of supply voltages from the maximum voltage allowed by the technology used down to less than two MOSFET threshold voltages.

According to the invention, the CMOS operational amplifier with a Class AB output stage has an output terminal and an input stage driving the output stage. The Class AB output stage includes a pair of p-channel and n-channel output transistors series-connected between the VDD and VSS supply terminals of a power supply. Each of the output transistors has associated driving and biasing circuitry with a pair of differential (positive and negative) driving inputs and a biasing input. The input stage has driving outputs connected to corresponding ones of the driving inputs of the output stage. Each driving output is derived from the drain of a MOS transistor connected in series with a diode connected MOS transistor between the VDD and VSS supply terminals. By avoiding the conventional stacked MOSFETs that would set the minimum supply voltage to more than two threshold voltages, the op-amp can be operated over the full range of supply voltage. Unlike conventional designs, the input stage does not use a common source amplifier with a current mirror as load. Instead, the diode-connected transistors are used as load. These diode loads provide the correct dc operation point for the differential inputs of the output stage. The diode loads also reduce the gain, and improve the stability, of the input stage. For an intended use as a buffer the output of the op-amp can drive resistive loads efficiently as current source or current sink. Although a sufficient open loop gain (60 dB or more) can be achieved, the op-amp when used as a buffer remains stable at capacitive loads of 100 nF or more.

A compromise must be found between accuracy (that requires a high gain of the input stage) and stability (that requires a moderate gain of the input stage). An embodiment with an increased gain includes a resistor in series with each diode load. A further increase in gain is achieved in an embodiment with cross-coupled load transistors for the differential input transistors.

Further advantages and features of the invention will appear from the following description with reference to the drawings.

DETAILED DESCRIPTION OF THE DRAWINGS

Figure 1:
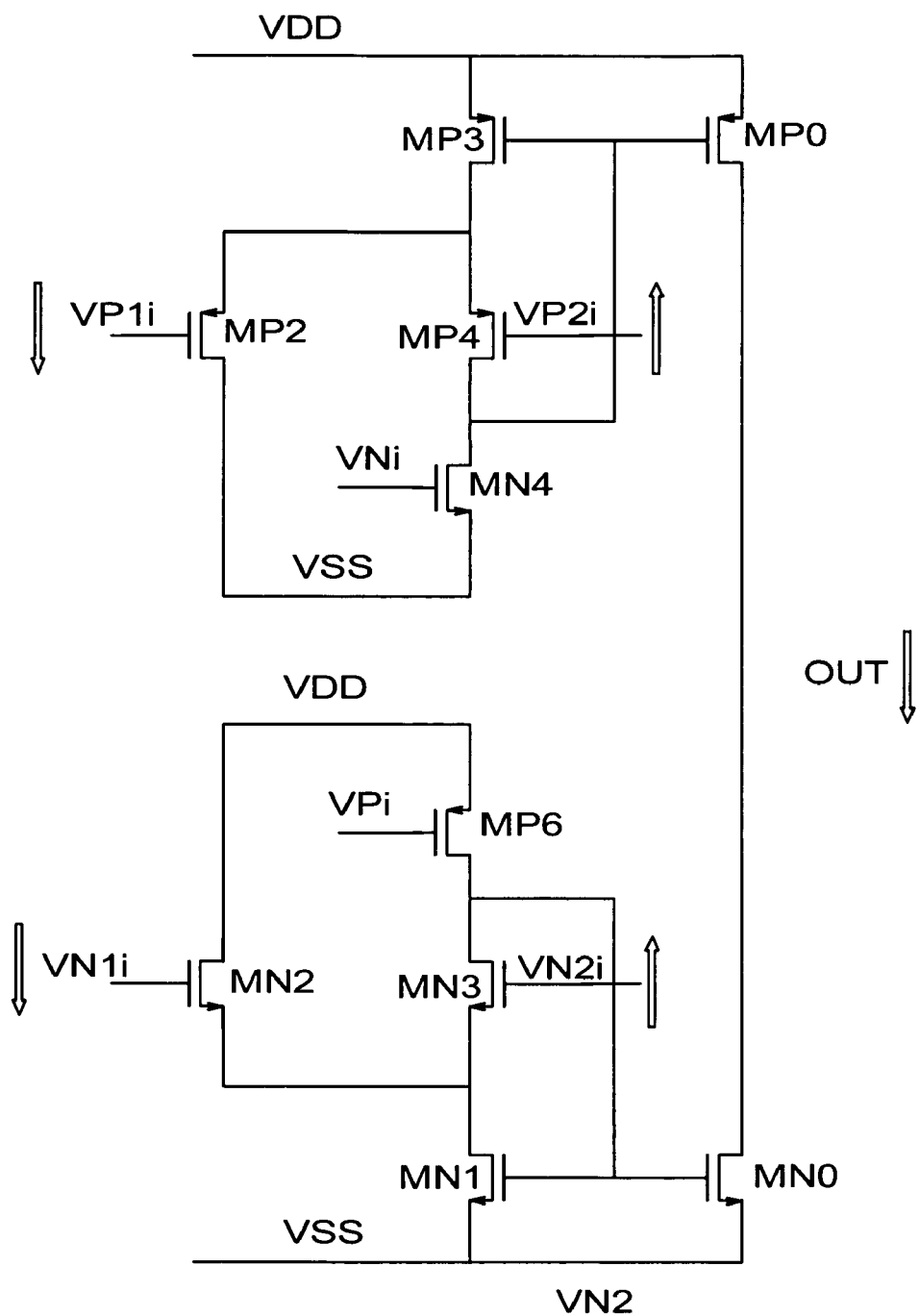
FIG. 1 is a diagram of an output stage of the operational amplifier.

With reference to FIG. 1, the output stage of a Class AB CMOS operational amplifier includes a p-channel output transistor MP0 and an n-channel output transistor, the interconnected drains of which constitute the output of the circuit and the sources of which are connected to the VDD and VSS supply terminals, respectively. Transistor MP0 has associated driving and biasing circuitry with a p-channel current mirror transistor MP3 the source of which is connected to terminal VDD, the gate of which is connected to the gate of transistor MP0 and the drain of which is connected to the interconnected sources of a pair of p-channel driver transistors MP2, MP4. The gates of driver transistors MP2 and MP4 form a pair of differential drive inputs VP1$i$ and VP2$i$. Driver transistor MP2 has its drain connected to terminal VSS and driver transistor MP4 has its drain connected to the drain of an n-channel bias control transistor MN4, the gate of which forms a bias control input VN$i$ and the source of which is connected to terminal VSS. The drains of transistors MP4 and MN4 are also connected to the gates of transistors MP3 and MP0.

In a similar manner, driving and biasing circuitry is associated with output transistor MN0, but in a complementary conductivity type. Thus, the circuitry has n-channel driver transistors MN2, MN3, n-channel current mirror transistor MN1 and p-channel bias control transistor MP6, with differential inputs VN1$i$ and VN2$i$ and bias control input Vp$i$.

Figure 2:
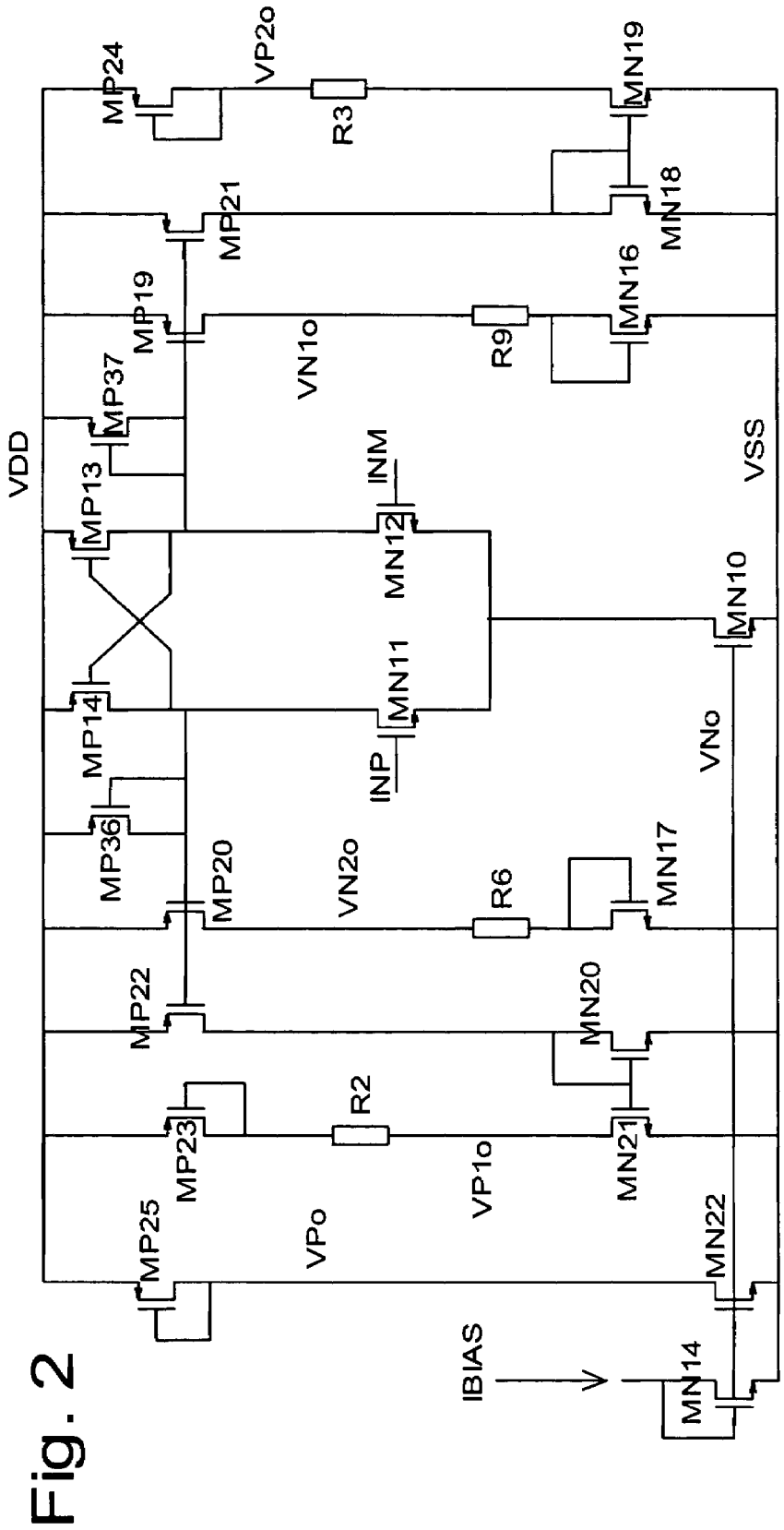
FIG. 2 is a diagram of an input stage of the operational amplifier.

The input stage shown in FIG. 2 includes differential input n-channel transistors MN11 and MN12 with cross-coupled p-channel load transistors MP13, MP14 and n-channel bias control transistor MN10. Differential inputs INP and INM are applied to the gates of transistors MN11 and MN12. A diode connected n-channel transistor MN14 receives a bias control current IBIAS on its drain and has its source connected to terminal VSS, providing a bias control signal VNo to the gate of transistor MN10. A second bias control signal VPo is provided at the interconnected drains of diode connected p-channel transistor MP25 and n-channel current mirror transistor MN22.

Diode connected p-channel transistors MP36 and MP37 are connected across the source and drain of transistors MP14 and MP13, respectively.

Differential output signals VN1o and VN2o are provided at the drains of p-channel transistors MP19 and MP20, respectively. The gates of transistors MP19 and MP20 are connected to the drains of transistors MP13 and MP14, respectively. Transistor MP19 is connected in series with a resistor R9 and a diode connected n-channel transistor MN16. In similar manner, transistor MP20 is connected in series with a resistor R6 and a diode connected n-channel transistor MN17. Differential output signals VP1o and VP2o are provided at the drains of n-channel transistors MN21 and MN19, respectively. Transistor MN21 is connected in series with a resistor R2 and a diode connected p-channel transistor MP23. In similar manner, transistor MN19 is connected in series with a resistor R3 and a diode connected p-channel transistor MP24. The gate of transistor MN21 is connected to the drain of inverter transistor MP22, a p-channel transistor that has its gate connected to the drain of transistor MP14 and its source to terminal VDD, and that is connected in series with a diode connected n-channel transistor MN20. In a similar manner, the gate of transistor MN19 is connected to the drain of inverter transistor MP21, a p-channel transistor that has its gate connected to the drain of transistor MP13 and its source to terminal VDD, and that is connected in series with a diode connected n-channel transistor MN18.

Figure 3:
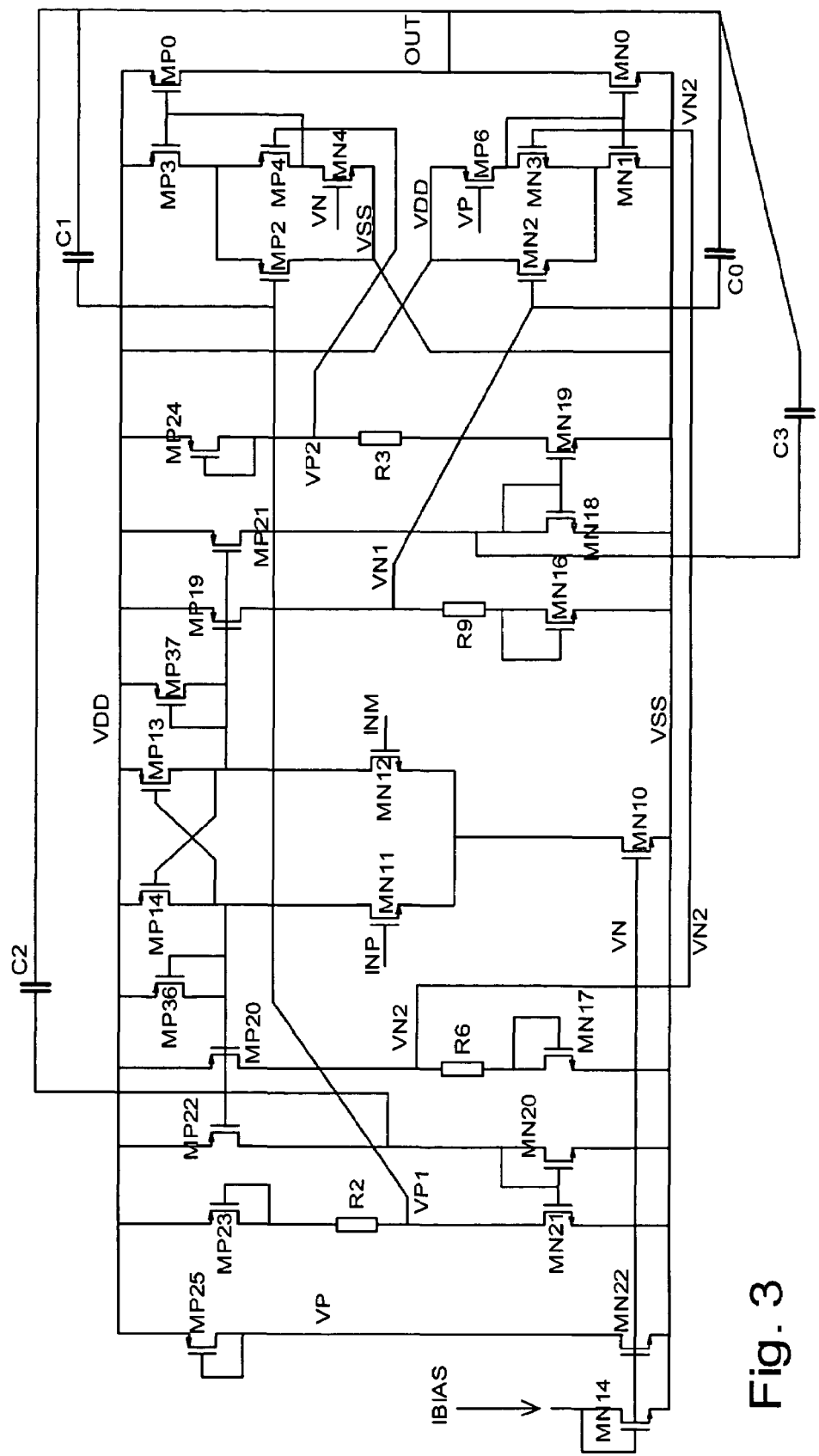
FIG. 3 is a diagram of the entire operational amplifier with an optional nested Miller compensation.

As can be seen in FIG. 3, the input and output stages of FIGS. 1 and 2 are of course combined in circuit device so that each signal input VP1i, VP2i, VN1i, VN2i and VNi, VPi is connected with a corresponding signal output VP1o, VP2o, VN1o, VN2o and VNo, VPo. In addition, a nested Miller compensation is achieved with feedback capacitors C0, C1 that are connected between the output of the amplifier and the gates of transistors MP2 and MN2, respectively, and feedback capacitors C2, C3 connected between the output of the amplifier and the interconnected drains of transistors MP22, MN20 and transistors MP21 and MN18, respectively. The Miller compensation is optional and depends on the capacitive load of the operational amplifier. Typically, a Miller compensation will be used at a low capacitive load of the order of 100 pF.

In operation, the diode connected transistors MP23, MP24 and MN16, MN17 always provide the correct dc operation point for the differential inputs of the output stage, from the maximum voltage permitted with the technology used down to a low supply voltage less than twice a MOSFET threshold voltage.

The invention claimed is:
1. An operational amplifier comprising:
a Class AB output stage having an output terminal and an input stage driving the output stage,
said Class AB output stage comprising a pair of p-channel and n-channel output transistors (MP0, MN0) series-connected between the VDD and VSS supply terminals of a power supply, each of said output transistors having associated driving and biasing circuitry with a pair of differential driving inputs (VP1i, VP2i; VN1i, VN2i) and a biasing input (VPi; VNi); and
said input stage comprising driving outputs (VP1o, VP2o, VN1o, VN2o) connected to corresponding driving inputs (VP1i, VP2i; VN1i, VN2i) of said output stage, each driving output being derived from the drain of a MOS transistor (MN21, MP20, MN19, MP19) connected in series with a diode connected MOS transistor (MP23, MN17, MP24, MN16) between the VDD and VSS supply terminals,
wherein said input stage has a pair of biasing outputs (VPo, VNo) each connected to a corresponding one of the pair of biasing inputs (VPi, VNi) of the output stage, a first one (VPo) of said biasing outputs being derived from the connected drains of a complementary MOS transistor pair connected in series between the VDD and VSS supply terminals, a first one of said transistor pair being a diode connected MOS transistor (MP25) and a second one (MN22) being connected as an inverter and having a control gate connected to the drain of a bias current control transistor (MN14) the drain of which is supplied with a bias current (IBIAS).

2. The operational amplifier according to claim 1, wherein a second one (VNo) of the biasing outputs is derived from the drain of the bias current control transistor (MN14).

3. The operational amplifier according to claim 1, wherein the second biasing output (VNo) is also applied to the control gate of a bias control MOS transistor (MN10) the source of which is connected to one (VSS) of the supply terminals and the drain of which is connected to the connected sources of a pair of differential input transistors (MN11, MN12) the drains of which are connected with the drain of a respective complementary MOS load transistor (MP13, MP14) that has a source connected to the other one (VDD) of the supply terminals.

4. The operational amplifier according to claim 3, wherein each of said load transistors (MP13, MP14) has a control gate connected to the drain of the other one of the load transistors.

5. The operational amplifier according to claims 1, wherein the series connection between the MOS transistor (MN21, MP20, MN19, MP19) and the diode connected MOS transistor (MP23, MN17, MP24, MN16) includes a respective resistor (R2, R6, R9, R3).

6. An operational amplifier comorising:
a Class AB outout stage having an output terminal and an input stage driving the output stage,
said Class AB outout stage comprising a pair of p-channel and n-channel output transistors (MP0, MN0) series-connected between the VDD and VSS supply terminals of a power supply, each of said output transistors having associated driving and biasing circuitry with a pair of differential driving inputs (VP1i, VP2i; VN1i, VN2i) and a biasing input (VPi; VNi); and
said input stage comprising driving outputs (VP1o, VP2o, VN1o, VN2o) connected to corresponding driving inputs (VP1i, VP2i; VN1i, VN2i) of said output stage, each driving output being derived from the drain of a MOS transistor (MN21, MP20, MN19, MP19) connected in series with a diode connected MOS transistor (MP23, MN17, MP24, MN16) between the VDD and VSS supply terminals,
wherein Miller compensation capacitors (C0, C1, 02, C3) are directly connected between the output terminal of the output stage and appropriate terminals of the input stage.

* * * * *